United States Patent [19]

Singer

[11] 3,919,555

[45] Nov. 11, 1975

[54] DIRECT VIEW INFRA-RED TO VISIBLE LIGHT CONVERTER

[75] Inventor: Barry M. Singer, New York, N.Y.

[73] Assignee: North American Philips Corporation, New York, N.Y.

[22] Filed: Oct. 17, 1974

[21] Appl. No.: 515,450

[52] U.S. Cl. ................. 250/332; 250/330; 307/304

[51] Int. Cl.² .......................................... H01J 31/50

[58] Field of Search ........... 250/330, 332, 333, 370; 307/304

[56] References Cited

UNITED STATES PATENTS

| | | | |
|---|---|---|---|
| 3,721,839 | 3/1973 | Shannon | 307/304 |
| 3,842,274 | 10/1974 | Greene et al. | 250/330 |
| 3,846,820 | 11/1974 | Lampe et al. | 250/332 X |

*Primary Examiner*—Archie R. Borchelt
*Attorney, Agent, or Firm*—Frank R. Trifari; Carl P. Steinhauser

[57] ABSTRACT

A solid state imaging device employing JFETs and a pyroelectric material as a sensor. In the absence of infra-red radiation incident on the pyroelectric material, each JFET has its channel blocked by a depletion region formed by pulsing the pyroelectric material. Under illumination by infra-red radiation, the depletion region withdraws, opening up the channel. Each JFET element has a drain which has a low electron affinity and emits electrons which are converted to visible light by a luminescent screen positioned to intercept the electrons.

10 Claims, 3 Drawing Figures

DIRECT VIEW INFRA-RED TO VISIBLE LIGHT CONVERTER

The invention relates to a direct view infra-red to visible light converter and in particular comprises a solid state imaging device employing JFETs and a pyroelectric material as a sensor. In the absence of infra-red radiation incident on the pyroelectric material, each JFET has its channel blocked by a depletion region formed by applying a positive pulse to the pyroelectric material. Under exposure to infra-red radiation the depletion region withdraws, opening up the channel. Each JFET has a drain which has a low electron affinity and emits electrons which are intercepted by a luminescent screen and converted to visible light.

In U.S. Pat. 3,721,839 there is described a solid state imaging device employing FETs as sensors in a charge storage mode. In the non-illuminated condition, each FET has its channel blocked by a depletion region formed by pulsing the gate. Under illumination, the depletion region withdraws, opening up the channel. Each image element is then sensed by pulsing its source or drain, following which its gate is pulsed to reblock the channel.

While there are similarities between the device according to the invention and that described in the patent, there are significant differences which will appear from the more detailed description which follows. Broadly, however, in the device according to the invention, the pyroelectric layer is pulsed which blocks the channel of the JFET and the infra-red radiation incident upon the pyroelectric layer unblocks, or opens the channel. Another significant difference is that the drain has a low electron affinity and therefore can emit electrons which can be intercepted by a luminescent screen and inverted to visible light thus serving to convert the incident infra-red radiation directly to visible light.

The invention will be described with reference to the accompanying drawing in which.

Figure 1:
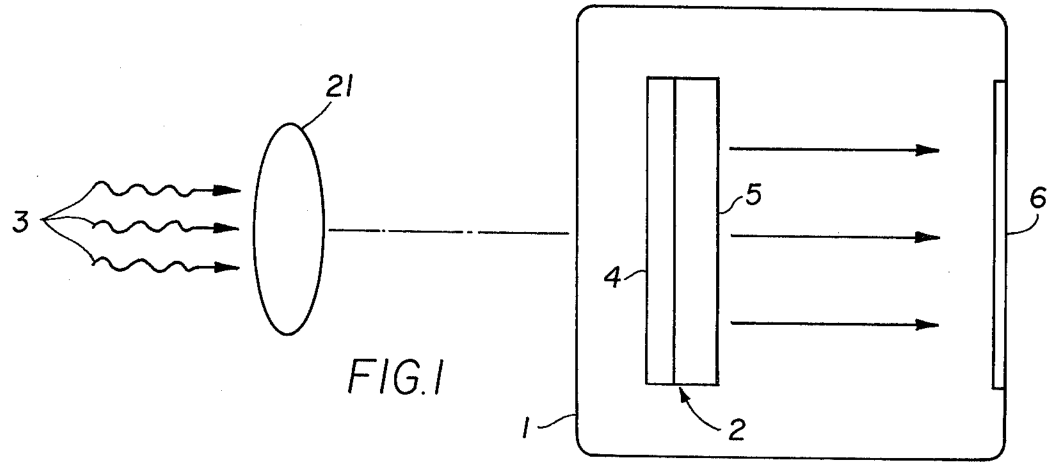
FIG. 1 is a schematic view of a direct view infra-red to visible light converter according to the invention.

The direct view infra-red to light converter as shown in FIG. 1 includes an evacuated envelope 1 in which an infra-red sensor 2 is positioned to receive infra-red radiation 3 which is focussed by a lens 21. The infra-red sensor includes a layer 4 of tri-glycerine sulfate (TGS) which responds to infra-red radiation by producing a potential, and a semi-conductive wafer 5 comprising a number of individual discrete JFETs. Within the same envelope and positioned to intercept electrons produced by the semi-conductive wafer in response to infra-red radiation incident on the TGS layer 4 in a manner hereinafter described is a phosphor screen 6 which produces visible light.

Figure 2:
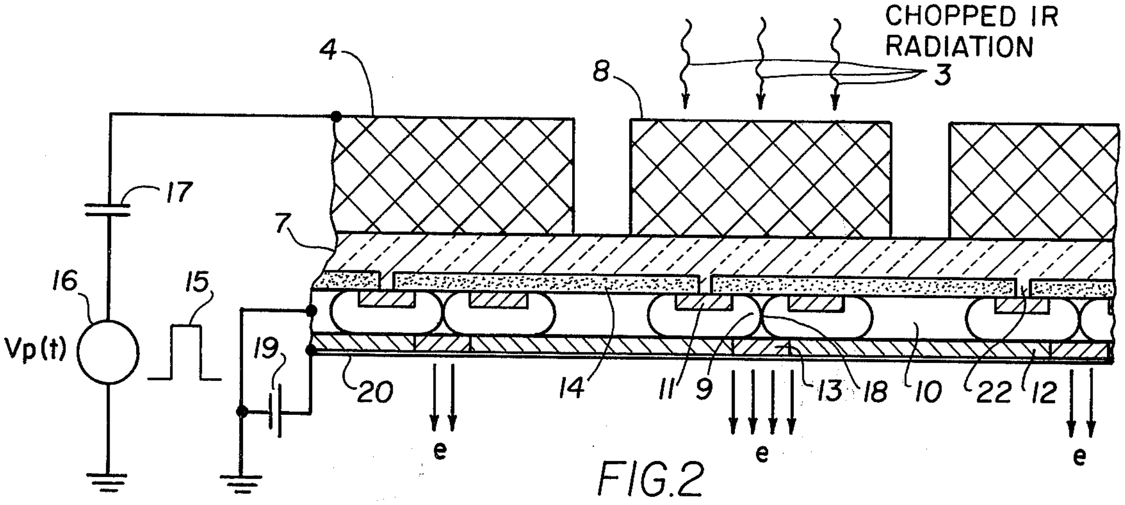
FIG. 2 is a sectional view in elevation of the sensor element.
Figure 3:
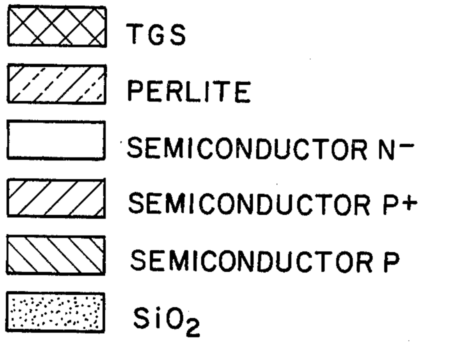
FIG. 3 is a top view of a JFET.
Figure 3:
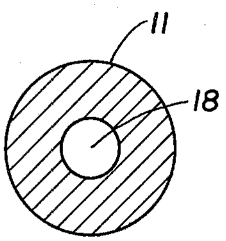

The manner in which the infra-red sensor 2 converts the incident infra-red radiation to electrons is shown in FIG. 2. The incident infra-red radiation generally shown by arrows 3 strikes the TGS layer 4 which is subdivided into a plurality of islands 8 by kerfs to reduce lateral conduction as described in copending application Ser. No. 507,712 filed Sept. 20, 1974 and assigned to the assignee of this application.

The TGS layer 4 is mounted and thermally insulated from the semi-conductive wafer 5 by a layer of perlite 7. The semiconductive wafer 5 includes a number of discrete JFETs generally designated 9 which are formed in the semi-conductive layer.

The semi-conductive wafer which consists principally of n-type silicon 10 is doped to provide annular regions 11 of $p^+$-type silicon. The surface 12 of the silicon wafer opposite the TGS layer 4 is doped to be p-type and is further doped to provide p+ regions 13 which have a low electron affinity, i.e., they emit electrons readily. These *p*+ regions constitute drains for the JFETs formed by the annular gates 9.

The surface of the silicon wafer abutting the perlite layer 7 is covered with an interrupted layer 14 of silicon dioxide ($SiO_2$) having gaps 22 over the annular gate 11.

In operation, the pyroelectric layer 4 is pulsed with a positive voltage pulse 15 delivered by a generator 16 through capacitor 17. The effect of this pulse which is applied across the entire sensor 2 is to charge the gate 11 and block the channel 18 formed between the gate and the drain 13. This is because in effect, the pyroelectric layer and perlite layer constitute a capacitance which is in series with a reversed biassed diode which allows a charge to build up on the gate. The bulk of the semi-conductive element is biassed by a potential furnished by battery 19.

When infra-red radiation is incident on the pyroelectric layer 4, the voltage across this layer drops and changes the voltage on the gate 11 of the JFET allowing current to conduct from the drain 13 some of which will diffuse to the p+ vacuum interface and escape into the vacuum.

In order to facilitate the emission of electrons from the drains, the p surface of the silicon is covered with a monomolecular layer 20 of cesium on oxygen which forms a dipole layer lowering the electron affinity of the p-layer.

Other modifications of this invention are possible without departing from its spirit or scope.

What is claimed is:

1. A direct view infra-red to visible light converter comprising an evacuated envelope having therein a semi-conductor photocathode, a layer of pyroelectric material over and thermally insulated from said semi-conductor photocathode, means responsive to electrons positioned to respond to electrons emitted by said semi-conductor photocathode to create a visible image, means to apply a potential to said pyroelectric layer which is reduced by incident infra-red radiation, and means to apply a potential to said semi-conductor photocathode at which a current flow is produced therein when said potential applied to said pyroelectric layer is reduced by the incident infra-red radiation, said semi-conductor photocathode comprising at least one field effect transistor having source and drain regions spaced apart by a channel region and having a gate region separated by a barrier from the channel region and capable when pulsed of establishing a depletion region in the channel, an electron-emissive element comprising a p-type semi-conductor and an injecting junction located not substantially more than a diffusion length for electrons from a free surface of said P-type semi-conductor, said p-type semi-conductor, injecting junction and one of the transistor source and drain regions being electrically connected in series, said transistor structure being mounted such that infra-red radiation incident on the pyroelectric layer which reduces the potential across the pyroelectric layer changes the potential on said gate thereby allowing current to conduct from the source to the drain.

2. A direct view infra-red to visible light converter as claimed in claim 1 wherein the semi-conductor photocathode, on the side facing the means responsive to the electrons for producing a visible image is provided with an electron emissive layer comprising a monomolecular layer of cesium on oxygen.

3. A direct view infra-red to visible light converter as claimed in claim 1 wherein the pyroelectric layer is supported by the semi-conductive photocathode on the side remote from the electron responsive means for producing visible light.

4. A direct view infra-red to visible light converter as claimed in claim 1 wherein the means to apply a potential to pyroelectric layer is a pulse producing means which blocks the channel of semi-conductor photocathode.

5. A direct view infra-red to visible light converter as claimed in claim 1 wherein the semi-conductor photocathode has a bulk region of n-type conductivity which constitutes a source between the gate and the drain.

6. A direct view infra-red to visible light converter as claimed in claim 5 wherein the gate is an annular region of p-type conductivity.

7. A direct view infra-red to visible light converter as claimed in claim 6 wherein the drain is a region of $p^+$-type conductivity opposite the gate.

8. A direct view infra-red to visible light converter as claimed in claim 7 in which the semi-conductor is silicon.

9. A direct view infra-red to visible light converter as claimed in claim 8 wherein the pyroelectric layer is sub-divided and consists of a plurality of elements of tri-glycerine sulfate.

10. A direct view infra-red to visible light converter as claimed in claim 9 wherein the tri-glycerine sulfate is separated from the semi-conductor by a layer of perlite which serves as a thermal insulator.

* * * * *